United States Patent [19]

Engeler

[11] 4,403,299

[45] Sep. 6, 1983

[54] SURFACE CHARGE CORRELATOR

[75] Inventor: William E. Engeler, Scotia, N.Y.

[73] Assignee: General Electric Company, Schenectady, N.Y.

[21] Appl. No.: 237,825

[22] Filed: Feb. 25, 1981

[51] Int. Cl.[3] .......................... G06G 7/19; G11C 11/40

[52] U.S. Cl. .......................................... 364/824; 357/24; 364/862

[58] Field of Search ..................... 364/824, 862; 357/24

[56] References Cited

U.S. PATENT DOCUMENTS

| | | | |
|---|---|---|---|
| 4,058,716 | 11/1977 | Goldberg | 364/824 |
| 4,058,717 | 11/1977 | Engeler | 364/824 |
| 4,084,257 | 4/1978 | Burke et al. | 364/862 |
| 4,161,785 | 7/1979 | Gasparek | 364/862 X |

*Primary Examiner*—Felix D. Gruber
*Attorney, Agent, or Firm*—Julius J. Zaskalicky; James C. Davis, Jr.; Marvin Snyder

[57] ABSTRACT

The correlator includes a plurality of charge storage cells, each including first and second storage regions and corresponding first and second electrodes insulatingly overlying the storage regions.

Into each of the first charge storage regions a respective quantity of charge proportional to a respective sample of an analog signal is introduced. A series of voltage waveforms are developed each successive waveform being identical to the period of a preceding waveform except delayed by the period of a cycle of the waveform in response to a digital reference word.

Each of the voltage waveforms are applied to a respective one of the second electrodes of the cells for controlling the transfer of charge between the first and second charge storage regions thereof, a transfer in one direction representing a multiplication of an analog sample by +1 and a transfer in the other direction representing a multiplication of an analog sample by −1.

The total net charge transferred to and from the first charge storage regions during a common period of the voltage waveforms is sensed to produce a summation of the products of each of the cells.

7 Claims, 29 Drawing Figures

SURFACE CHARGE CORRELATOR

This invention relates in general to signal processing apparatus comprising charge transfer devices and in particular to such apparatus for obtaining the correlation between an analog signal and a digital reference word.

The invention of this application relates to improvements on the signal processing apparatus described and claimed in U.S. Pat. No. 4,058,717 assigned to the assignee of this invention.

An object of this invention is to provide signal processing apparatus capable of multiplying a signal sample represented by a quantity of charge by +1, −1, or 0.

Another object of this invention is to provide signal correlator apparatus using relatively simple surface charge cells and having a relatively simple cycle of operation.

Another object of this invention is to provide signal correlation apparatus which can include a very large number of surface charge cells yet operates at low power and relatively high speed.

A further object of this invention is to provide an organization of signal correlation apparatus which enables such apparatus including a large number of surface charge cells to be integrated in monolithic form.

In carrying out the invention in an illustrative embodiment thereof, there is provided a substrate of semiconductor material in which a plurality of charge storage cells are formed. Each cell includes a first charge storage region and also a second charge storage region adjacent a major surface of the substrate. The second charge storage region is separated from the first charge storage region by an intermediate region. A plurality of interconnected first electrodes are provided, each insulatingly overlying a respective first charge storage region. A plurality of second electrodes is also provided, each insulatingly overlying a respective second charge storage region. Means are provided for developing a series of voltage waveforms including a series of cycles, each cycle having a duration equal to the sum of first and second periods, each period divided into first and second subperiods, each waveform of the series being the same as the preceding voltage waveform of the series delayed by one cycle. Means are provided for introducing quantities of charge into selected ones of the first charge storage regions of the cells during selected first subperiods of first periods of the voltage waveforms, each quantity of charge being proportional to a respective sample of a time-varying analog signal and being introduced into a respective first charge storage region. Means are provided for applying each of the aforementioned waveforms to a respective one of the second electrodes of the cells in succession. A high absolute level of a waveform applied to a second electrode of a cell causing charge in the first storage region thereof to transfer to the second storage region thereof and a low absolute level of a waveform applied to a second electrode of a cell causing charge in the second storage region thereof to transfer to the first storage region thereof. Each of the waveforms has a low absolute level during a first subperiod and an absolute level which is either high or low during a succeeding second subperiod in response to a respective reference signal. Thus, charge in each cell is transferred between the first and second charge storage regions thereof in a time sequence determined by a respective reference signal.

Means are provided connected in circuit with the first storage electrodes for sensing the total net charge transferred to and from the first charge storage regions during a common period of the voltage waveforms.

The features which are believed to be characteristic of the present invention are set forth with particularity in the appended claims. The invention itself, both as to its organization and method of operation, together with further objects and advantages thereof may best be understood by reference to the following description taken in connection with the accompanying drawings in which:

Figure 1:
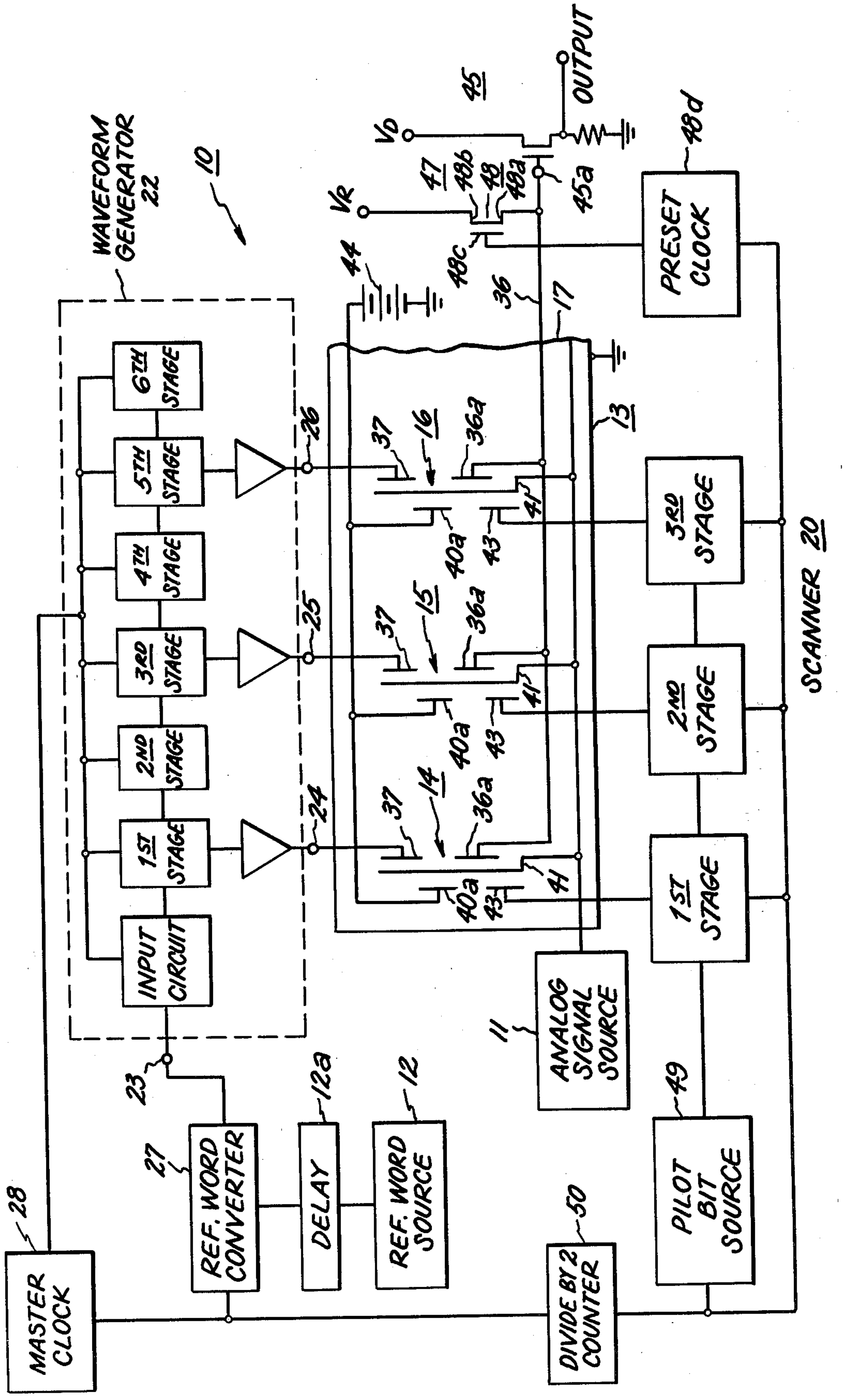
FIG. 1 is a block diagram of surface charge signal correlation apparatus in accordance with an embodiment of the present invention.

Reference is now made to FIG. 1 which shows surface charge signal correlation apparatus 10 for providing the correlation between a time varying analog signal from a source 11 and a reference word from source 12. The reference word may be in the form of a PN sequence, for example. A PN sequence is a sequence of the values of +1 and −1 and may be represented by a digital sequence having values of 1 or 0, where the 1 corresponds to a positive element and the 0 corresponds to a negative element. This digital sequence is converted to a Manchester Code sequence by reference word converter 27, wherein each bit is represented by two successive bits, a 1 bit of the digital word, corresponding to positive element of the sequence, is represented by a 1 followed by a 0, and 0 bit of the digital word, corresponding to the negative element of the sequence, is represented by a 0 followed by a 1. The reference word converter 27 is an organization of commonly used logic circuits well known to those skilled in the art. The apparatus includes an assembly 13 of a plurality of charge transfer devices 14, 15 and 16 formed on a common substrate 17, only three of which are shown for reasons of simplicity in describing the apparatus and explaining the operation thereof. The apparatus also includes a multistage scanner 20, each stage of which is operatively associated with a respective charge transfer device for sequentially gating samples of the analog signal into the charge transfer devices. A voltage waveform generator 22 is provided having an input terminal 23 and a plurality of output terminals, only the first three terminals 24, 25 and 26 of which are shown. To assure proper timing of the output of reference word converter 27 a device 12*a* producing a delay is provided between reference word source 12 and reference word converter, as will be explained below. The reference word in Manchester Code format is applied to the input terminal 23 of the waveform generator 22 and at each of the output terminals 24, 25 and 26 of the waveform generator 24 is obtained a respective voltage waveform for controlling the signal processing in a respective one of charge transfer devices 14–16.

Figure 2:
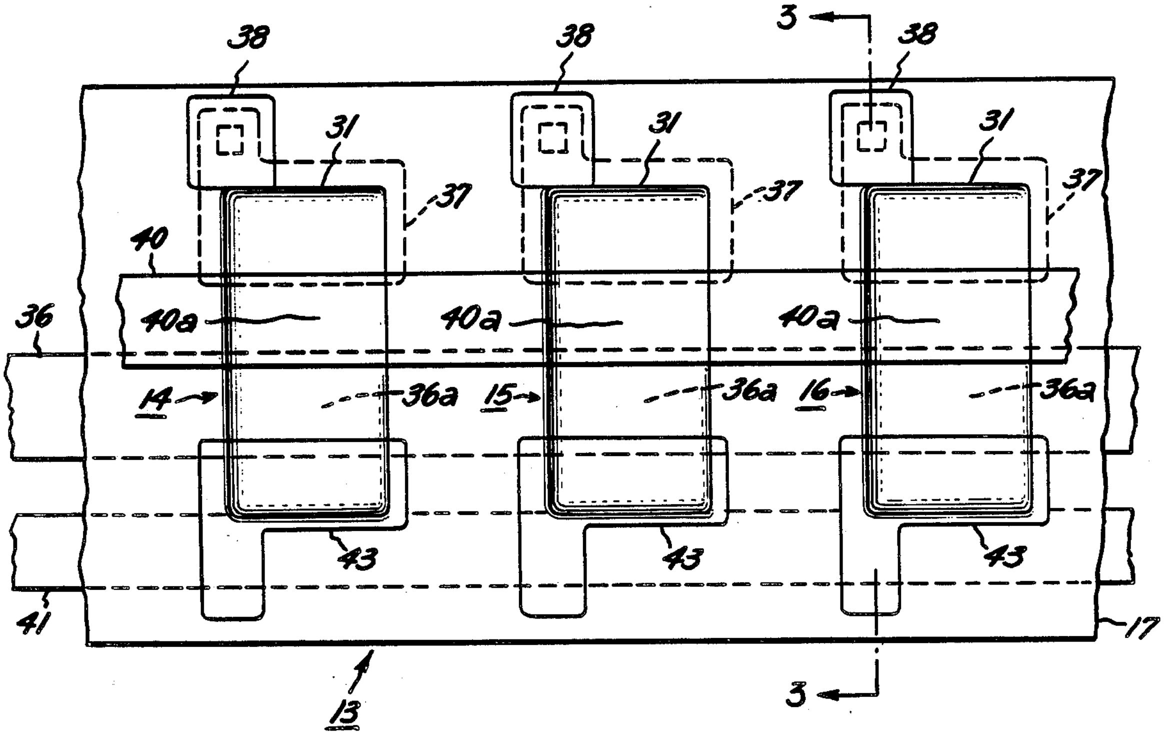
FIG. 2 is a plan view of an assembly of several charge storage cells of the surface charge signal correlation apparatus of FIG. 1 integrated on a single substrate.
Figure 3:
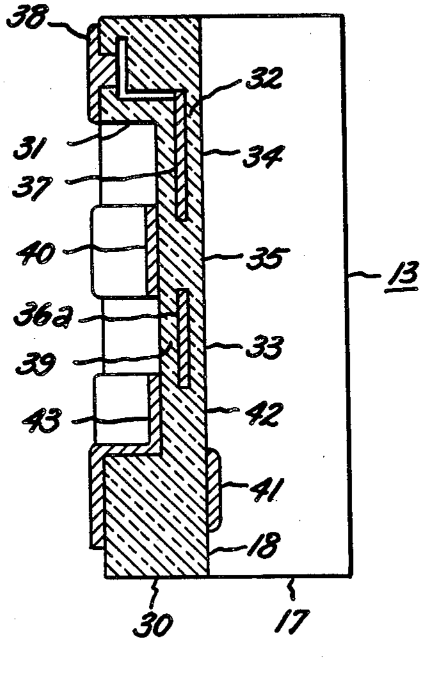
FIG. 3 is a sectional view of the assembly of FIG. 2 taken along section lines 3—3 thereof.

As shown in FIGS. 2 and 3, the devices 14–16 are formed on a common substrate 17 of, for example P-type conductivity silicon of a suitable resistivity, for example 10 ohm-cm. The substrate is provided with a major surface 18. A layer 30 of thick insulating material, which may conveniently be silicon dioxide, is provided overlying the major surface 18. A plurality of generally rectangular recesses 31 are provided in the thick insulating member 30 each recess corresponding to the location of a respective charge transfer device or cell. Each of the recesses 31 extends to within a short distance of the major surface of the semiconductor substrate to provide a region of thin insulation 32 lying over the substrate and defining a charge transfer cell therein. Each of the charge transfer cells 14–16 includes a first charge storage region 33 and a second charge storage region 34 spaced from the first charge storage region and defining a respective first intermediate region 35 therebetween, all adjacent the major surface 18. Overlying the thick and thin portions of the insulating member 30 and extending generally perpendicular to the long dimension of the recesses 31 is a conductive member or line 36. The portions of the conducting member 36 lying in the recesses constitute a first plurality of first electrodes 36*a*, each electrode overlying a respective first storage region 33 of a charge transfer device or cell. A plurality of second electrodes 37 are provided, each electrode in a respective recess and each overlying a respective second charge storage region 34 in the charge transfer cells. Terminals 38 provide electrical connection to the electrodes 37. A second layer 39 of thin insulation is provided in each of the recesses 31. Overlying the thick and thin portions of the insulating member and extending generally perpendicular to the long dimension of the recesses 31 is a conductive member or line 40. The portions of the conductive member 40 lying in the recesses constitute a plurality of first gating electrodes 40*a* each overlying a respective intermediate region 35. Also provided in the semiconductor substrate is a region 41 of N-type conductivity spaced from the first charge storage regions 33 of each of the cells and defining a respective second intermediate region 42 therebetween. A plurality of second gating electrodes 43 are provided each in a respective recess and each overlying a respective second intermediate region 42.

Referring now particularly to FIG. 1, the first gating electrodes 40*a* of each of the devices 14–16 are connected to the positive terminal of a source 44 of potential, the negative terminal of which is connected to ground to establish a surface potential in each of the first intermediate regions 35 of a fixed value. Each of the first storage electrodes 36*a* of each of the devices 14–16 are interconnected by the line 36 which is connected to the input terminal 45*a* of the output circuit 45. In the operation of the apparatus it is necessary to reset the line 36 to a fixed potential for one period of time and to allow this electrode to float during another period of time. The fixed potential on line 36 is set to provide a surface potential in the first storage regions which is less in absolute magnitude than the fixed value of surface potential on intermediate region 35 underlying stationary gate electrode 40*a*. To this end a reset circuit 47 is provided including a transistor 48 having a source 48*a*, a drain 48*b* and a gate 48*c*. The source 48*a* is connected to the line 36, the drain 48*b* is connected to a source of reset potential $V_R$ and the gate 48*c* is connected to the preset clock 46*d* which is under control of the master clock 28 through divide-by-two counter 50. The region 41 of opposite conductivity type is connected to the analog signal source 11. Each of the second gating electrodes 43 is connected to a respective stage of the scanner 20. In respnse to a pilot bit applied to the scanner 20 from a pilot bit source 49, a pulse is applied to each of the second gating electrodes 43 in sequence during selected intervals to sample the analog signal appearing on the region 41 and transfer into each of the first storage regions 33 of the devices in sequence a respective quantity of charge proportional to a respective sample of the analog signal as will be explained in more detail below.

The reference word converter 27 converts a series of successive binary bits of a reference word from source 12 into a reference word in Manchester Code in which a bit of one value is represented by a first level followed by a second level and a bit of the other value is represented by the second level followed by the first level.

In response to the reference word in Manchester Code obtained from the reference word converter 27 and applied to the input of waveform generator 22, the waveform generator 22 develops a plurality of voltage waveforms at the output terminals 24–26 thereof. A first voltage waveform is developed at terminal 24, a second voltage waveform is developed at output terminal 25, a third voltage waveform is developed at output terminal 26 and so on. The second waveform is identical to the first voltage waveform except that it is delayed by two master clock cycles. The third voltage waveform is identical to the first voltage waveform except that it is delayed by four master clock cycles. Each of the waveforms includes a series of cycles, each cycle having a duration equal to the sum of first and second clock cycle periods, each period including a first subperiod and a second subperiod. In response to a reference bit of one value aforementioned, a voltage waveform having a duration of two periods is developed at the output terminal 24. The voltage waveform has a low level during the first subperiod of the first period thereof, a high level during the second subperiod of the first period thereof and has low levels during the first and second subperiods of the second period thereof. In response to the bit of the other value aforementioned, another voltage waveform having a duration of two periods is developed. The voltage waveform has a low level during the first and second subperiods of the first period thereof. The voltage waveform has a low level during the first subperiod of the second period thereof. The voltage waveform has a high level. A high absolute level of the voltage waveform applied to a second electrode of a cell causes charge in the first storage region thereof to transfer to the second storage region thereof and a low absolute level of the voltage applied to the second electrode of a cell causes charge in the second storage region thereof to transfer to the first storage region thereof. Thus, when the waveform which has developed in response to a one bit is applied to a second electrode of a cell, charge is contained in the first storage region thereof during the first subperiod of the first period, is transferred to the second storage region thereof during a second subperiod of the first period. During the first subperiod of the second period, charge is returned to the first storage region thereof as the potential of the second electrode is lowered and remains in the first storage region thereof during the second subperiod of the second period. When the voltage waveform developed in response to a zero bit is applied to the second electrode, charge is contained in the first storage region thereof during the first subperiod of the first period, remains in the first storage region during the second subperiod of the first period and during the first subperiod of the second period, and is transferred to the second storage region thereof during the second subperiod of the second period as the potential on the second electrode is lowered at this time.

During the first and second subperiods of the first period of the voltage waveform the line 36 and the first electrodes 36*a* to which line 36 is connected are maintained at a preset value by activation of preset circuit 47. During the first and second subperiods of the second period, the preset circuit 47 is inactivated and the electrodes 36*a* are allowed to float. During the second period of the waveform charge is transferred into or out of a first storage region of a cell resulting in a net charge transfer into or out of the first storage regions thereby producing a change in voltage on the line 36 which is measure of this net charge transfer. At the output source follower 45, a net change in voltage is obtained which represents this net transfer of charge and represents a correlation output.

Figure 4:
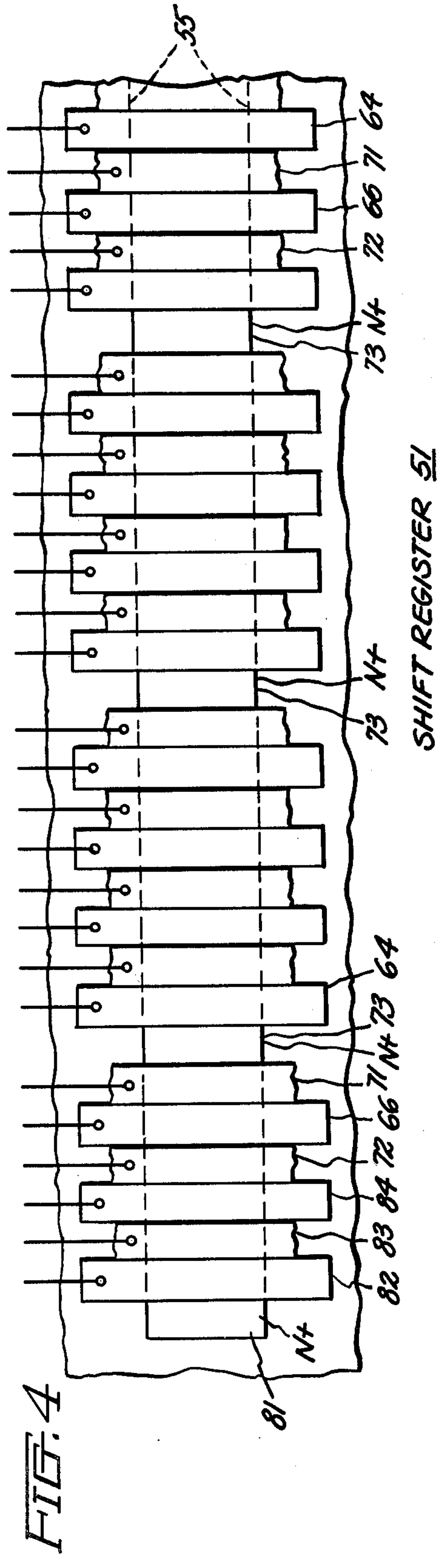
FIG. 4 is a plan view of the voltage waveform generation apparatus of FIG. 1 comprising a charge transfer shift register.
Figure 5:
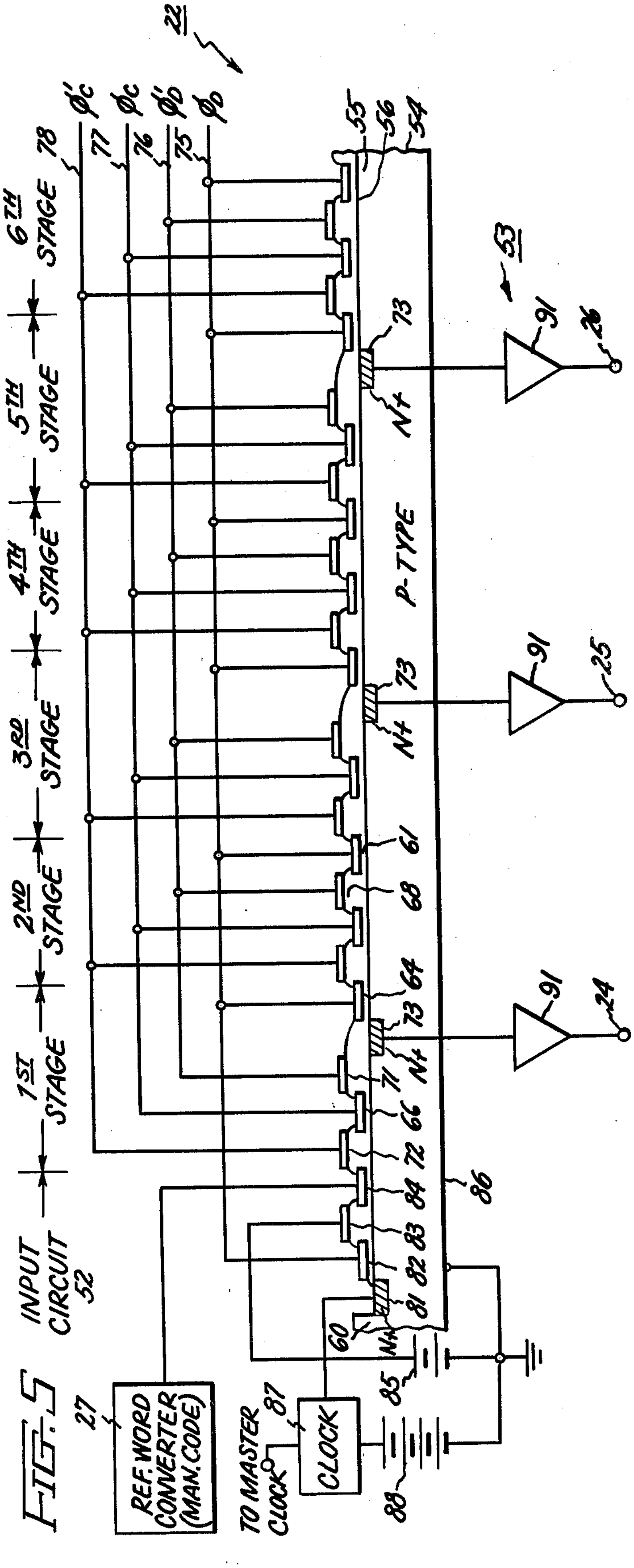
FIG. 5 is a sectional view of the apparatus of FIG. 4 taken along section lines 5—5 thereof.

Reference is now made to FIGS. 4 and 5 which show one form of voltage waveform generator 22 for converting a reference word in Manchester Code into outputs at a plurality of output terminals of the character described above. The waveform generator 22 comprises a charge transfer shift register 51 including a plurality of stages, an input circuit 52 for converting a sequence of bits in Manchester Code into packets of charge for introduction of these packets into the shift register 51 and an output circuit 53. The shift register 51 is formed upon a semiconductor substrate 54 of p-type conductivity which has a channel portion 55 of uniform width adjacent the major surface 56 of the substrate. Typically, the substrate 54 may be silicon semiconductor material of 10 ohm-cm resistivity. Overlying the major surface of the substrate 54 is a thick insulating member 60 having a thin portion 61 which is of generally rectangular outline and lies in registry with the first channel portion 55 of the substrate. A plurality of first electrodes 64 conveniently referred to as $\phi_D$ electrodes are provided on the insulating member 60 overlying the thin portion 61 thereof and orthogonal to the length thereof. Each of the first electrodes 64 is of uniform length in the direction of the length of the semiconductor channel portion 55 and each of the first electrodes 64 extends across the thin insulating portion 61 and the bordering thick insulating portions of the insulating member 60.

A plurality of second electrodes 66 conveniently referred to as $\phi_C$ electrodes are provided on the insulating member 60 overlying the thin portion 61 thereof and orthogonal to the length thereof. Each of the second electrodes 66 is of uniform length in the direction of the length of the channel portion 54 and equal to the uniform length of each of the first electrodes 64. Each of the second electrodes 66 are spaced between adjacent first electrodes 64 and each extends completely over the thin insulating portion 61 of the insulating member 60 as well as the bordering thick insulating portions thereof. An insulating layer 68 is provided over the electrodes 64 and 66. Preferably, the electrodes 64 and 66 are constituted of doped polycrystalline silicon. This material may be readily oxidized into a silicon dioxide composition which provides the insulating layer 28 over these electrodes. Other materials that may be utilized for these electrodes include molybdenum, molybdenum silicide and aluminum.

A plurality of first transfer electrodes 71 conveniently referred to as $\phi'_D$ electrodes are provided over the insulating layer 28 with each of the first transfer electrodes 71 insulatingly spaced between respective adjacent electrodes 66 and 64. A second plurality of second transfer electrodes 72 conveniently referred to as $\phi^{40}{}_C$ are provided over the insulating layer 68 with each of the transfer electrodes 72 insulatingly spaced between respective adjacent electrodes 64 and 66. Each of the transfer electrodes 71 and 72 is of substantially uniform extent in the direction of the length of the channel portion and extends entirely over the thin insulating portion 51 of the insulating member 50 as well as the bordering thick insulating portions thereof. The transfer electrodes may be constituted of the same material as the first and second pluralities of electrodes, that is, polycrystalline silicon suitably doped to increase the conductivity thereof.

Each set of four consecutive electrodes 72, 66, 71, 64 constitutes a stage of the shift register. In the first, third and fifth stages of the shift register, the electrode 64 referred as the $\phi_D$ electrode is spaced from electrode 71 the $\phi^{40}{}_D$ electrode of that stage by a gap. Underlying the gap and located in the substrate is an elongated region 73 of conductivity type opposite to the conductivity type of the substrate, namely N-type conductivity, for enabling the potential of the surface of the substrate underlying the electrode to be sensed as will be explained below.

As shown the $\phi'_D$ electrodes 71 and the $\phi'_C$ electrodes 72 are spaced farther from the major surface of the substrate than the $\phi_D$ and the $\phi_C$ electrodes. Thus, with the same level of voltage applied to the transfer electrodes 71 and 72 as is applied to the electrodes of the first and second pluralities, the surface potential in the substrate underlying the transfer electrodes 71 and 72 would be less in absolute value, that is, less inverted than the surface potential underlying the electrodes of the first and second pluralities thereby enabling a reduced number of different voltages to be applied to the electrodes to function the apparatus, as apparent from FIGS. 7A and 7B and as will be more fully explained below.

Figure 7A:
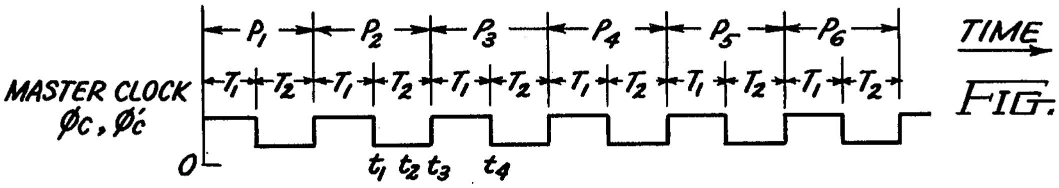
FIGS. 7A–7L are diagrams of amplitude versus time of voltages and charge occurring at various points in the apparatus of FIG. 1.
Figure 7B:

All of the first electrodes 64 are connected to a common line 75 to which a $\phi_D$ voltage is applied. All of the second electrodes 66 are connected to a common line 77 to which a $\phi_C$ voltage is applied. All of the transfer electrodes immediately preceding, that is on the left hand side or the charge input side of the first electrodes 64 are connected to a common line 76 to which a $\phi'_D$ voltage is applied. All of the transfer electrodes 72 located on the input side of the second electrodes 66 are connected to the common line 78 to which a $\phi'_c$ voltage is applied. The voltages $\phi_D$, $\phi_C$, $\phi'_D$, $\phi'_C$, applied to the lines 75, 77, 76 and 78 are shown in FIGS. 7A and 7B.

Figures 6A, 6B, 6C:
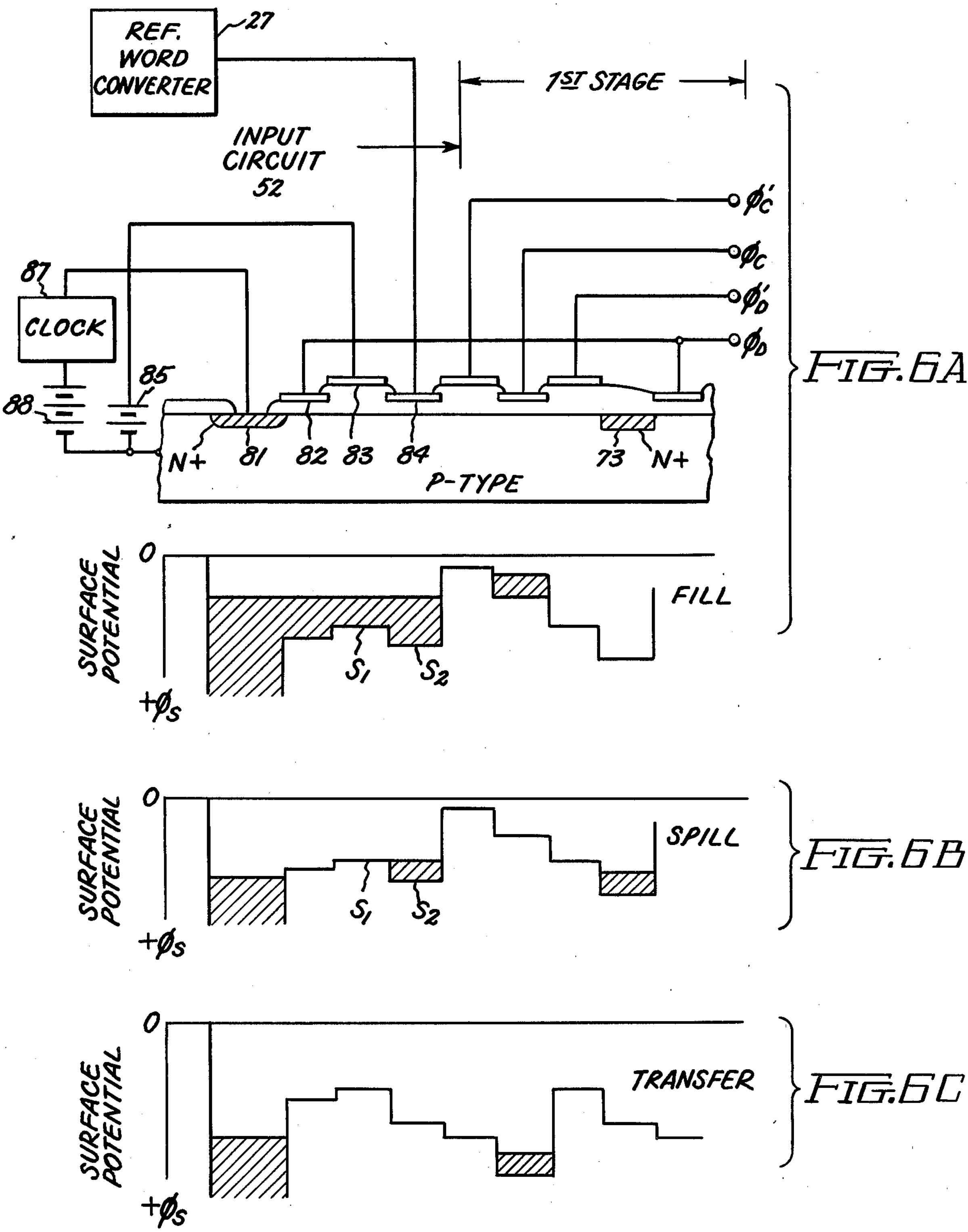
FIG. 6A is a sectional view of the charge input section of the apparatus of FIGS. 4 and 5 including a diagram of semiconductor surface potential versus distance along the surface of the semiconductor substrate useful in explaining the manner in which charge is inserted or introduced into the charge transfer shift register.
FIGS. 6B–6C are diagrams of semiconductor surface potential versus distance along the surface of the semiconductor substrate at other points in time in a cycle of forming a packet of charge for insertion into the charge transfer shift register of FIGS. 4 and 5.

Also provided in the embodiments of FIGS. 4 and 5 and also shown in FIG. 6A is a charge input circuit 52 for serially forming and inserting or introducing packets of charge into the first stage of the shift register 51 in synchronism with clocking voltages applied to the electrodes of the shift register in accordance with the bits of the reference word. The first stage of the shift register 51 comprises in the order named a transfer electrode 72 connected to line 78, referred to as a $\phi'_C$ electrode, a storage electrode 66 connected to line 77, referred to as a $\phi_C$ electrode, a transfer electrode 71 connected to line 76 referred to as a $\phi'_D$ electrode and a storage electrode 64 connected to line 75 referred to as $\phi_D$ electrode. The charge input circuit 52 includes a source of charge in the form of an N-type conductivity region 81 of elongated configuration orthogonally disposed with respect to the length of the channel portion 55 and located at the left hand end thereof. The charge input circuit 52 also includes an isolation electrode 82, a reference electrode 83 and a signal input electrode 84 arranged in the order recited between the region 81 and the first stage of the shift register. The isolation electrode 82 is identical to the electrodes 64 of the first plurality. The electrode 82 overlies the thin insulating portion 61, is orthogonal to the length thereof and is also of the same width as electrode 66 in the direction of the length of the channel 55. The electrode 83 is identical to electrode 71. The electrode 83 overlies insulating portion 68 is orthogonal to the length of the channel portion 55 and is also of the same width as electrode 71 in the direction of the length of the channel portion 55. The electrode 84 is identical to the first electrode 64. The electrode 84 overlies the thin insulating portion 61 is orthogonal to the length thereof and is also of the same width as electrode 64 in the direction of the length of the channel portion 55. Each of electrodes 82, 83 and 84 extend completely over the thin insulating portion 61 of insulating member as well as the bordering thick insulating portions thereof. Electrode 82 is connected to line 75, that is, to the source of $\phi_D$ voltage. The electrode 83, referred to as the reference electrode, is connected to the positive terminal of a bias source 85 the negative terminal of which is connected to ground and also to the substrate through conductive layer 86. The conductive layer 86 is constituted of a suitable material such as gold and is bonded to the lower surface of the substrate 54 forming an ohmic contact therewith. Input electrode 84 is connected to the output of the reference word converter 27. The N-type region 81 is connected to the output $\phi_{FS}$ of the input clock 87. The input clock 87 is positively biased by a source 88 of bias potential with respect to ground and the substrate to establish a positive bias thereon which in the quiescent stage is more positive than the surface potential of the substrate underlying the isolation electrode 62. The manner in which the various electrodes of the input circuit are biased and operate to provide charge packets to the first stage of the shift register will be explained below in connection with FIGS. 6A, 6B and 6C.

The output section of the apparatus comprises a plurality of logic signal inverting circuits 91, the input of each of which is connected to the N-type sensing region 73 for a respective one of the first, third, fifth stages. Output waveforms are obtained at the output terminals 24–26 of the logic signal inverting circuit 91.

The manner in which packets of charge are transferred from stage to stage in the shift register 51 of FIGS. 4 and 5 will now be described in connection with the waveform diagrams of FIGS. 7A and 7B. Each stage of the shift register includes a $\phi'_C$ electrode 72, a $\phi_C$ electrode 66, a $\phi'_D$ electrode 71 and a $\phi_D$ electrode 64 recited in the order in which they appear in the direction of charge transfer in the shift register. To these electrodes are connected respectively the voltages $\phi'_C$, $\phi_C$, $\phi'_D$, and $\phi_D$ shown in FIGS. 7A and 7B. The pulse voltages $\phi_C$ and $\phi'_C$ are preferably identical, as shown. The $\phi_C$ and $\phi'_C$ voltages alternate between a high potential level and a low potential level in respect to minority carrier charges in the substrate. These voltages when applied to the $\phi_C$ and $\phi'_C$ electrodes produce surface potentials which vary between a high positive surface potential level to a low surface potential level for minority carriers, namely electrons in a P-type conductivity substrate. As the $\phi'_C$ electrodes are spaced a greater distance than the $\phi_C$ electrodes from the surface of the substrate, the surface potentials appearing under $\phi'_C$ electrodes are lower in absolute value than the corresponding surface potentials appearing under the $\phi_C$ electrodes for the same level of voltage applied thereto. The fixed voltages $\phi_D$ and $\phi'_D$, which are also shown as identical, produce surface potentials in the substrate underlying the $\phi_D$ and the $\phi'_D$ electrodes which are different in view of the fact that the $\phi'_D$ electrodes are spaced farther from the surface of the substrate than the $\phi_D$ electrodes. Accordingly, the surface potential of the substrate underlying the $\phi'_D$ electrodes is lower than the surface potential in the substrate underlying the $\phi_D$ electrodes for minority carriers for the same level of applied voltage. The $\phi_D$ voltage is set to have a level lying between the upper level and the lower level of the $\phi_C$ voltage. The $\phi'_D$ voltage is set to lie between the lower and upper levels of the $\phi'_C$ voltage. Adjustments to these levels may be accomplished by ion implantation of activator impurities into the semiconductor surface. At time $t_1$ (FIG. 7A), the $\phi_C$ and the $\phi'_C$ voltages drop from the high level to low level thereby providing surface potential underlying the $\phi_C$ and $\phi'_C$ electrodes which are lower than the surface potentials underlying the $\phi_D$ and $\phi'_D$ electrodes. As the surface potential underlying the $\phi'_C$ electrodes is always less positive than the surface potential underlying the $\phi_C$ electrodes charge in the $\phi_C$ storage regions is inhibited from flowing from right to left and flows instead from left to right from a $\phi_C$ storage region through the region underlying a $\phi'_D$ electrode into the storage region underlying a $\phi_D$ electrode. Thus, as potentials of the storage regions underlying the $\phi_D$ electrodes are now greater than the potentials of the storage regions underlying the $\phi_C$ electrodes, charge can flow from the storage regions underlying the $\phi_C$ electrodes over the potential barrier underlying the $\phi'_D$ electrodes into the $\phi_D$ storage regions. At time $t_3$ both the $\phi_C$ and the $\phi'_C$ voltages rise from the lower level to the upper level thereof setting the surface potentials in the surface regions underlying the $\phi_C$ electrodes at a value above the surface potential underlying the $\phi_D$ electrodes with surface potential underlying the $\phi_D$ electrodes lower than the surface potential underlying the $\phi_C$ electrodes. Thus, during the time interval $t_3$ to $t_4$ charge from the storage regions underlying the $\phi_D$ electrodes flows into the storage regions underlying $\phi_C$ electrodes thereby completing a cycle of transfer of charge in the shift register. In subsequent clocking cycles the cycle is repeated to cause charge to be clocked from left to right in the shift register.

The manner in which the charge is developed and transferred to the first stage of the shift register of FIGS. 4 and 5 is shown in FIGS. 6A, 6B and 6C. FIG. 6A shows a portion of the apparatus of FIG. 4 depicting the input circuit of the shift register including the $\phi'_C$ and the $\phi_C$ electrodes of the first stage. The parts of the circuit of FIG. 6A identical to the parts of the circuit of FIGS. 4 and 5 are identically designated.

Figure 7C:
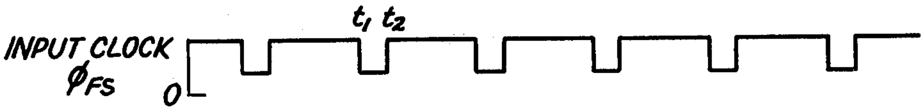

FIGS. 6A, 6B and 6C show the potential existing at the surfaces of the semiconductor substrate as a function of the distance along the surface at respective successive intervals of time upon the application of voltages to N-type region 81, electrode 82, electrode 83 and electrode 84. The voltage of FIG. 7C is applied to N-type region 81. The voltage of FIG. 7B is applied to electrode 82. A bias voltage of appropriate value from source 85 biases the electrode 83 to an appropriate reference value with respect to the substrate. The voltage of FIG. 7G showing the waveform of the output of the reference word converter 27 is applied to electrode 84. At time $t_1$ at the beginning of the second subperiod, $T_2$ of period $P_2$ of the master clock, the potential of the N-type region 81 drops below the surface potential $S_1$ appearing in a first region in the substrate underlying the reference electrode 83 in response to the clock voltage of FIG. 7C dropping to a low value and remains below this potential $S_1$ over the interval $t_1$ to $t_2$. Thus, charge is caused to flow into a second storage region in the substrate underlying signal electrode 84 in which a surface potential $S_2$ has been established by applying the reference word signal to this electrode, as shown in FIG. 7G. At time $t_2$ (FIG. 7C), the potential of the N-type region 81 rises above the potential $S_1$ of the first region and excess charge in the second storage region spills over the potential barrier formed in the first region back into the N-type region 81 until the surface potential in the second region equilibrates with the surface potential $S_1$ in the first region. This occurs during the spill interval, $t_2$ to $t_3$. The size of the packet in the second storage region depends on the difference in potential between $S_2$ and $S_1$. This packet is shown in FIG. 6B and also in FIG. 7H. During the time interval $t_3$ to $t_4$ representing the first subperiod $T_1$ of the third period $P_3$ of the master clock, this packet of charge is transferred into the storage region underlying the $\phi_C$ electrode of the first stage of the shift register as the potential on the $\phi_C$ electrode rises to its high or positive value, as shown in FIG. 6C. During the second subperiod $T_2$ of this period $P_3$, the $\phi_C$ voltage drops to its low positive value thereby transferring the packet of charge into the storage region of this stage underlying the $\phi_D$ electrode. The transfer of charge into this storage region underlying the $\phi_D$ electrode lowers in absolute magnitude the surface potential thereof. As the N-type region 73 (FIG. 5) is contiguous with this storage region its potential also falls and, accordingly, an inverted output as shown in FIG. 7J is obtained. During two master clock cycles or two waveform periods, a packet of charge is clocked to the third stage of the shift register where it is sensed by the N-type region 73 located in this stage and provides positive output at the output terminal of the inverting circuit connected thereto. Similarly, during two additional master clock cycles, the charge is clocked to the fifth stage of the shift register where it is sensed by the N-type region 73 located in this stage and provides a positive output at the output terminal of the inverting circuit connected thereto.

The manner of generating a packet of charge in response to a zero bit in Manchester Code representation in which a low level is followed by a high level is similar to the generation of a packet of charge in response to a one bit in Manchester Code except that the packet of charge is now developed during the second subperiod of the second period of the bit rather than the second subperiod of the first period of the bit as in the case of the one bit and the packet of charge is similarly clocked from the input stage to the first stage and from stage-to-stage of the shift register providing positive outputs during the fourth subperiod at the first output terminal and at subsequent output terminals at time periods delayed by one bit period or two master clock cycles.

Figure 7D:
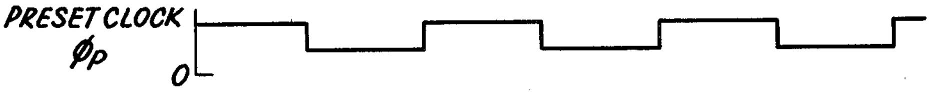
Figure 7E:
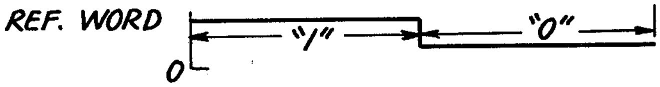
Figure 7F:
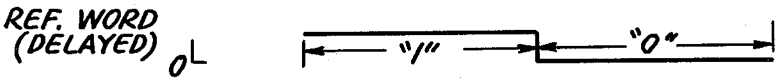
Figure 7G:
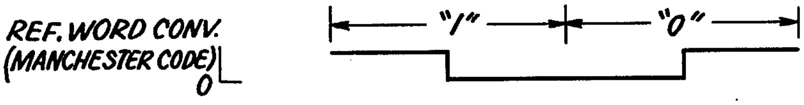
Figure 7H:
Figure 7I:
Figure 7J:
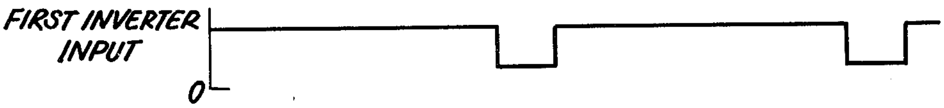
Figure 7K:
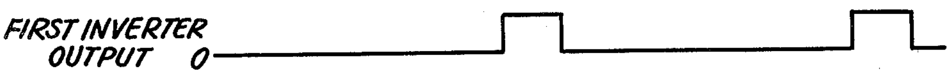
Figure 7L:

Thus, for the two bits in Manchester Code shown in FIG. 7G, that is, a one bit followed by a zero bit, a packet of charge is delivered to the first tap of the first stage during the second subperiod of the second period of the waveform produced in response to the one bit and another packet of charge is delivered to this tap during the second subperiod of the second period of the waveform produced in response to the zero bit thereby producing corresponding output voltages, as shown in FIG. 7L.

The operation of the correlator apparatus of FIG. 1 will now be described in connection with the waveform diagrams of FIGS. 7A–7L and also in connection with the surface potential diagrams of FIGS. 8A–8D and FIGS. 9A–9D.

FIGS. 7A–7L show waveforms appearing at various points in the apparatus of FIG. 1 over six master clock periods, $P_1$–$P_6$. All of the waveforms are drawn to a common time scale. The voltage waveform developed at the output terminals of the waveform generator 22 is constituted of two master clock periods, each of which has a first subperiod $T_1$ and a second subperiod $T_2$.

FIG. 7A shows the voltage obtained from the master clock 28 which provides the clocking and the timing of various parts of the apparatus.

FIG. 7B shows the $\phi_D$ and the $\phi'_D$ voltages utilized in connection with the $\phi_C$ and $\phi'_C$ voltages for functioning the shift register and other parts of the apparatus of waveform generator 22.

FIG. 7C shows the voltage waveform developed by the clock 87 (FIG. 5) in response to an input from master clock 28 input to provide an output for functioning the input circuit of the waveform generator 22.

FIG. 7D shows the voltage obtained from the preset clock 48*d* for functioning the preset circuit 47 for presetting the output line 36 of FIG. 1.

FIG. 7E shows a "one" bit followed by a "zero" bit of a reference word.

FIG. 7F shows the reference word of FIG. 7E delayed by one clocking cycle of the $\phi_c$ waveform of FIG. 7A.

FIG. 7G shows the "one" and the "zero" bit of FIG. 7F converted into Manchester Code representation by the reference word converter 27.

FIG. 7H shows the time of generation of a quantity of charge in the input stage of the waveform generator 22 in response to a "one" bit of a reference word and also in response to a "zero" bit of a reference word.

FIG. 7I shows the time of delivery of the charges shown in FIG. 7H to the tapped storage region 73 of the first stage of shift register 51.

FIG. 7J shows the change in voltage in the tapped storage region 83 of the first stage in response to the charges shown in FIG. 7I transferred thereto.

FIG. 7K shows the output voltage developed at the output of the inverter 91 connected to the tapped storage region of the first stage and appearing at the output terminal 24.

FIG. 7L shows the voltage appearing on output line 36 in response to the introduction of a sample of the analog signal into the first storage region of the first cell 14 and in response to the application of voltage waveform of FIG. 7K to the second electrode thereof causing the cycling of charge in the cell.

With the apparatus operating under control of the master clock 28, an analog signal is applied to the N-type region 41 from analog signal source 11. A pilot bit is applied to the first stage of the scanner 20 and is clocked from stage-to-stage of the scanner. Bits of the reference word from reference word source 12 are delayed one master clock cycle by delay circuit 12*a* and are applied to the reference word converter 27, the output of which appears at the input of waveform generator 22.

Figure 8A:
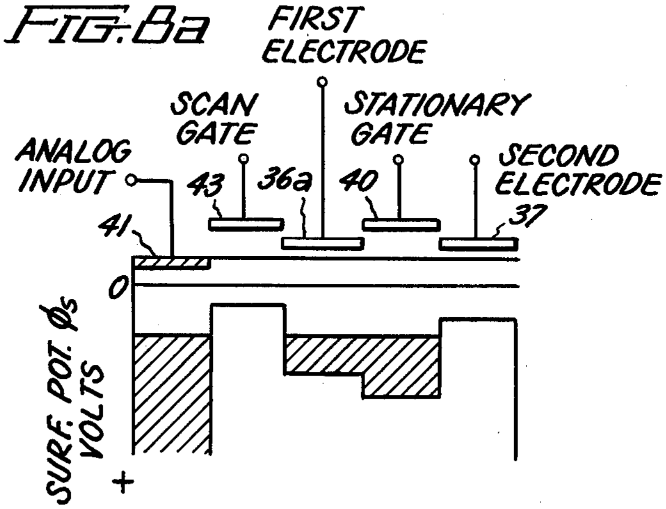
FIG. 8A shows a sectional view of a charge storage cell of the apparatus of FIG. 1 and also includes a diagram of semiconductor surface potential versus distance along the semiconductor surface during a first subperiod of a voltage waveform produced in response to a reference signal and applied to the second electrode of the cell.
Figure 8B:
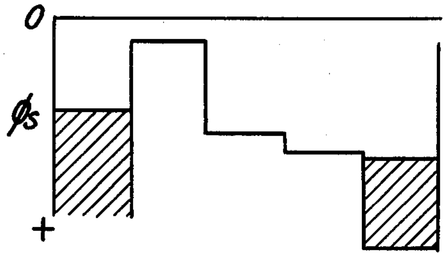
FIGS. 8B, 8C and 8D are diagrams of semiconductor surface potential versus distance along the semiconductor surface during the succeeding second subperiod, the first subperiod and the second subperiod, respectively, of the voltage waveform applied to the second electrode of the cell of FIG. 8A.
Figure 8C:
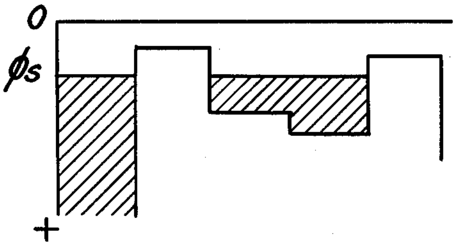
Figure 8D:
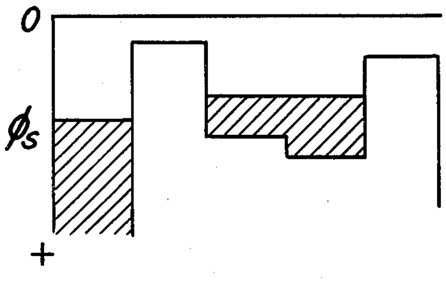

Consider the sequence of operation of a single charge transfer device or cell, in particular cell 14, assuming that a pilot appears in the first stage of the scanner 20 and that a reference "one" bit in Manchester Code representation is applied to the input of the waveform generator 22, as shown in FIG. 7G. The conditions existing in the charge transfer device 14 at the end of subperiod $T_1$ of period $P_3$ is depicted in FIG. 8A. The pilot bit in the first stage of the scanner 20 raises the surface potential under the scan gate 43 and allows charge to flow from the region 41 into the first storage region 33 underlying electrode 36*a* and equilibrate with the amplitude of the signal at that period of time. On termination of the pulse on the scan gate 43, a quantity of charge $Q_1$ is stored in the first storage region underlying the first storage electrode which is proportional to the amplitude of the analog signal. As the line 36 is maintained at a fixed value during the subperiods $T_1$ and $T_2$ of period $P_3$ by the application of the preset voltage $\phi_p$ of the FIG. 7D to the preset transistor 48 of FIG. 1, an accurate sampling of the analog signal is obtained. During the second subperiod $T_2$ of the third period $P_3$ the voltage on the second electrode 37 is raised as shown in FIG. 7K causing the charge in the first storage region of this cell to transfer to the second storage region of the cell. The condition at the end of the second subperiod $T_2$ of period $P_3$ is shown in FIG. 8B. During the first subperiod of the fourth period $P_4$ the voltage on the electrode 37 drops causing a lowering of the surface potential of the second storage region thereby causing the charge in the second storage region to transfer back to the first storage region. The condition at the end of the first subperiod of period $P_4$ is shown in FIG. 8C which is the same as the condition existing at the end of the first subperiod $T_1$ of period $P_3$. During the second subperiod $T_2$ of period $P_4$ the voltage appearing on the second electrode 37 remains low and accordingly the charge in the first storage region of the cell remains in this cell. The condition at the end of the second subperiod $T_2$ of period $P_4$ is shown in FIG. 8D. During the first and second subperiods $T_1$ and $T_2$ of period $P_3$, the voltage on the output line 36 is fixed by activation of the preset circuit 47. During the following period $P_4$ the preset circuit is inactivated and the line 36 is allowed to float. As charge was transferred from the second storage region to the first storage region of cell 14 during the first subperiod of period $P_4$ and remained there during the second subperiod thereof, a change in voltage is produced on the line 36 as shown in FIG. 7L. This change in voltage applied to the source follower 45 appears at the output terminal thereof.

Figure 9A:
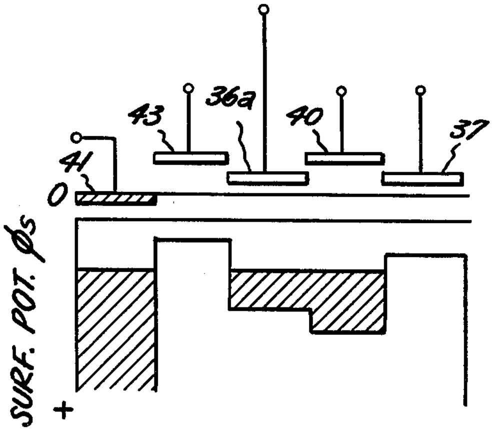
FIG. 9A shows a sectional view of a charge storage cell of the apparatus of FIG. 1 and also includes a diagram of semiconductor surface potential versus distance along the semiconductor surface during a first subperiod of a voltage waveform produced in response to a reference signal and applied to the second electrode of the cell.
Figure 9B:
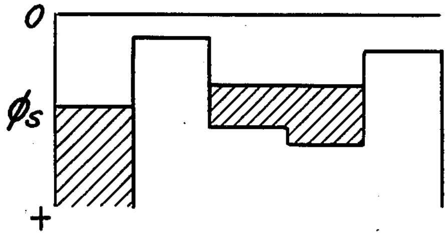
FIGS. 9B, 9C and 9D are diagrams of semiconductor surface potential versus distance along the semiconductor surface at the succeeding second subperiod, the first subperiod and the second subperiod of the voltage waveform applied to the second electrode of the cell.
Figure 9C:
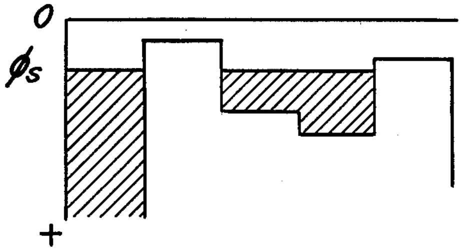
Figure 9D:
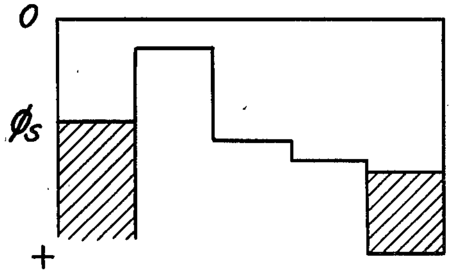

Consider the sequence of operation of a single charge transfer device or cell, in particular cell 14 assuming that a reference "zero" bit in Manchester Code format appears at the input of the waveform generator 22 following the "one" bit, as shown in FIG. 7G. During the first and second subperiods $T_1$ and $T_2$ of the period $P_5$ the voltage on the second electrode 37 is low as shown in FIG. 7K causing the charge in the first storage region of this cell to remain in the first storage region of the cell. The conditions at the end of the first and second subperiod $T_1$ and $T_2$ of period $P_5$ are shown in FIG. 9A and FIG. 9B, respectively. During the first subperiod $T_1$ of the sixth period $P_6$ the voltage appearing on the second electrode 37 remains low and accordingly the charge in the first storage region of the cell remains in this cell. The condition at the end of the first subperiod $T_1$ of period $P_6$ is shown in FIG. 9C. During the second subperiod of the sixth period $P_4$ the voltage on the electrode 37 rises causing a rise of the surface potential of the second storage region thereby causing the charge in the first storage region to transfer to the second storage region. The condition at the end of the second subperiod $T_2$ of period $P_6$ is shown in FIG. 9D. During the first and second subperiods $T_1$ and $T_2$ of period $P_5$, the voltage on the output line 36 is fixed by activation of the preset circuit 47. During the following period $P_6$ the preset circuit is inactivated and the line 36 is allowed to float. As charge was transferred from the first storage region to the second storage region of cell 14 during the second subperiod of period $P_6$, a change in voltage is produced on the line 36 as shown in FIG. 7L. This change in voltage applied to the source follower 45 appears at the output terminal thereof.

Similar action takes place in each of the other devices of the apparatus. Accordingly, at each clock cycle a correlation output is obtained at the output terminal source follower 45. Mathematically the output $V_{out}$ at a particular time may be represented by the equation:

$$V_{out}=K\Sigma Q_n W_n,$$

where $Q_n$ is the charge stored in the $n^{th}$ cell; $W_n$ is the weight factor which may be equal to +1 if the code located in the $n^{th}$ stage of the reference shift register is derived from a logic "one" bit, and $W_n$ is equal to −1 if code located in the $n^{th}$ stage is derived from a logic "zero" bit; or $W_n$ may be 0 if a three level code is employed, as described below; and K is a constant.

The operation of the apparatus of FIG. 1 was described in connection with a reference word provided by reference word source 13 in which each element thereof had one of two states or values, for example, +1 or −1. The apparatus of FIG. 1 will operate as well when the reference word provided by reference word source 12 has one of three states or values, for example, +1, −1 and 0. However, in the latter mode of operation a modification is necessary in the reference word converter 27 to provide an output of appropriate form in response to an input thereof of a 0 element. Before describing the form of the output, the operation of the apparatus on binary or two state reference words will be briefly recapitulated. A binary reference word from source 12 is converted by reference word converter 27 into a reference word in Mancester Code format in which an element of one value is represented by a first level followed by a second level and an element of the other value is represented by a second level followed by the first level. The waveform generator 22 converts the reference word in Manchester Code format into a voltage waveform having a first and a second period for each element of the reference word. Each period includes a first and a second subperiod. For an element of the reference word of one value the generator develops a voltage waveform having a low absolute level during a first subperiod of the first period, a high absolute value during a second subperiod of the first period and a low absolute level during a succeeding second period and in response to an element of the other value the generator develops a voltage waveform having a low absolute level during a first and second subperiod of a first period, a low absolute level during a first subperiod of a succeeding second period and a high absolute level during a second subperiod of the second period. The first voltage waveform has the effect of transferring charge from the second storage region into the first storage region of a cell during the second period of the waveform and the second voltage waveform has the effect of transferring charge from the first storage region to the second storage region of a cell during the second period of the waveform. Thus, a change in potential in one direction is provided on the line 36 connected to the first electrode in response to the an element as the aforementioned one value and a change in the potential in the opposite direction is produced on the line 36 in response to the an element of the aforementioned other value element. Accordingly, a net change in potential in one direction is produced on the line 36 corresponding to a +1 product contribution to the overall summation output and a net change in potential in the opposite direction is produced on line 36 corresponding to a −1 product contribution to the overall summation output.

To enable operation of the apparatus on reference words from source 12 in which each element thereof has one of three values, for example, +1, −1 and 0, the reference word converter 27 would be modified to provide in addition to the responses to the +1 and −1 values, a response of low level or a zero input from the reference word source 12 over the first and second periods of an element of the reference word. With a low level applied to the input circuit of the waveform generator 22, the waveform developed at an output terminal of the waveform generator would consist of a low level during the first and second subperiods of the first period thereof and a low level during the first and second subperiods of the second period thereof. Such a voltage waveform applied to the second electrode of a cell would cause no change in the location of the charge in the first storage region thereof. Accordingly, a zero output would be provided on the line 36 in response thereto corresponding to a zero product contribution to the overall summation output. In the alternative, the zero level of the reference word from source 12 could be converted by reference word converter 27 into an element in which during a first subperiod of a first period low level output is produced and during a second subperiod of the first period a high level output is produced, and also during a first subperiod of the second period low level is produced and during the second subperiod of the second period a high level is produced. Thus, during the second period of such a waveform applied to the second electrode of a cell, zero net charge transfer occurs between the first and second storage regions. Accordingly, a zero net change in potential is produced on the line 36 corresponding to a zero product contribution to the overall summation output.

While in the embodiment of FIG. 1, three charge transfer cells have been shown and described, a large number of such cells for example 256, could be utilized in view of the fact that drive power for operation of each of the cells is provided locally by a respective inverting circuit 91 (FIG. 5).

Figure 10:
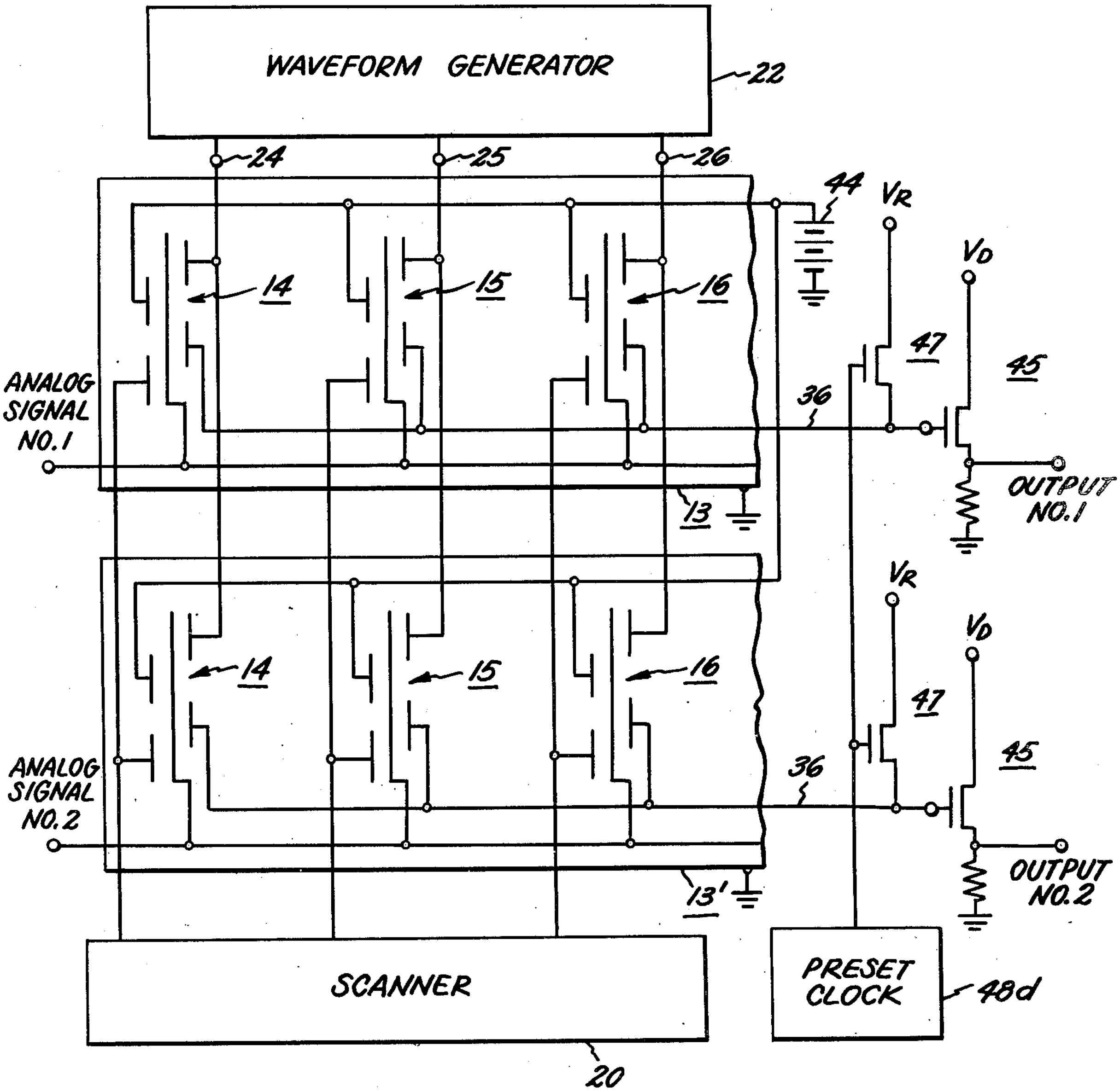
FIG. 10 shows a modification of the surface charge signal correlation apparatus of FIG. 1.

While in the embodiment of FIG. 1, the output of the waveform generator 22 is applied to a single assembly 13 of surface charge cells the output of the waveform generator could be applied to a second such assembly 13', as shown in FIG. 10. Samples of a separate and independent analog signal, referred to as analog signal No. 2, could be inserted into the cells of the second assembly 13' and separate outputs would be obtained on the output line 36 thereof. Thus, a correlation of a second analog signal to the single reference word applied to the input of the waveform generator 22 is obtained. If desired, additional assemblies of cells may be connected to the output of the waveform generator and additional analog signals provided to obtain correlations of a number of analog signals to a single reference word.

While in the embodiment of FIG. 1 one form of waveform generator 22 is shown and described for providing the voltage waveforms for cycling the second electrodes of the apparatus, other signal translating means such as single and multiphase inverter circuits may be utilized for providing the voltage waveforms in response to reference signals.

While in the embodiment of FIG. 1, the waveform generator 22 is implemented by a charge transfer shift register, other kinds of shift registers or encoding circuits may be utilized.

While the invention has been described in connection with charge transfer devices constituted of P-type conductivity substrates, N-type conductivity substrates could as well be used. Of course, in such a case the applied potentials, diffusions and carrier types would be reversed in polarity.

While the invention has been described in a specific embodiment, it will be appreciated that modifications may be made by those skilled in the art, and it is intended by the appended claims to cover all such modifications and changes as fall within the true spirit and scope of the invention.

What is claimed as new and is desired to secure by Letters Patent is:

1. Signal processing apparatus comprising:

a substrate of semiconductor material having a major surface, first means forming a plurality of first charge storage regions adjacent said major surface of said substrate, second means forming a plurality of second charge storage regions adjacent said major surface of said substrate, each separated from a respective first charge storage region by a respective intermediate region and forming a respective charge storage cell therewith, said first means including a plurality of first electrodes, each first electrode insulatingly overlying a respective first charge storage region, said first electrodes being interconnected, said second means including a plurality of second electrodes, each insulatingly overlying a respective second charge storage region, means for developing a series of voltage waveforms, each of said waveforms including a series of cycles, each cycle having a duration equal to the sum of first and second periods, each period constituted of first and second subperiods, each waveform of said series being the same as the preceding voltage waveform of said series except delayed by one cycle, means for introducing quantities of charge into selected ones of said first charge storage regions of said cells during selected first subperiods of first periods of said waveforms, each quantity of charge being proportional to a respective sample of a time-varying analog signal and introduced into a respective first charge storage region, means for applying each of said waveforms to a respective one of the second electrodes of said cells, a high absolute level of a waveform applied to a second electrode of a cell causing charge in the first storage region thereof to transfer to the second storage region thereof and a low absolute level of said waveform applied to a second electrode of a cell causing charge in the second storage region thereof to transfer to the first storage region thereof, each of said waveforms having a low absolute level during a first subperiod and an absolute level which is either high or low during a succeeding second subperiod in response to a respective reference signal, whereby charge in each cell is transferred between said first and second charge storage regions thereof in a time sequence determined by a respective reference signal, means connected in circuit with said first storage electrodes for sensing the total net charge transferred to and from said first charge storage regions during a common period of said voltage waveforms.

2. Signal correlator apparatus comprising:

a substrate of semiconductor material having a major surface, first means forming a plurality of first charge storage regions adjacent said major surface of said substrate, second means forming a plurality of second charge storage regions adjacent said major surface of said substrate, each separated from a respective first charge storage region by a respective intermediate region and forming a respective charge storage cell therewith, said first means including a plurality of first electrodes, each first electrode insulatingly overlying a respective first charge storage region, said first electrodes being interconnected, said second means including a plurality of second electrodes, each insulatingly overlying a respective second charge storage region, means for providing a reference word having a series of successive elements, generating means for developing a series of voltage waveforms in response to said reference word including a series of cycles, each cycle having a duration equal to the sum of first and second periods, each period constituted of first and second subperiods, each waveform of said series being the same as the preceding waveform of said series except delayed by one cycle, means for introducing into each of successive ones of said first charge storage regions of said cells during first subperiods of first periods of said waveforms a respective one of successive quantities of charge, each quantity of charge being proportional to a respective sample of a time-varying analog signal, means for applying each of said voltage waveforms to a respective one of the second electrodes of said cells, a high absolute level of a waveform applied to a second electrode of a cell causing charge in the first storage region thereof to transfer to the second storage region thereof and a low absolute level of said waveform applied to a second electrode of a cell causing charge in the second storage region thereof to transfer to the first storage region thereof, each of said waveforms having a low absolute level during a first subperiod and an absolute level which is either high or low during a succeeding second subperiod in response to a respective element of said reference word, whereby charge in each cell is transferred between said first and second charge storage regions thereof in a time sequence determined by a respective element of said reference word, means connected in circuit with said first storage electrodes for sensing the total net charge transferred to and from said first charge storage regions during a common period of said voltage waveform.

3. The correlator apparatus of claim 2 in which each element of said reference word has one of a first value and a second value in which in response to an element of said first value said generator develops a voltage waveform having a low absolute level during a first subperiod of a first period, a high absolute level during a second subperiod of said first period, and a low absolute level during a succeeding second period, and in which in response to an element of said second value said generator develops a voltage waveform having a low absolute level during a first period, a low absolute level during a first subperiod of a succeeding second period and a high absolute level during a second subperiod of said second period, whereby during said second period a signal of one polarity is developed on said first electrodes in response to an element of said first value and a signal of the opposite polarity is developed on said first electrodes in response to an element of said second value.

4. The correlator apparatus of claim 2 in which each element of said reference word has one of a first value, a second value and a third value intermediate between said first value and said second value, in which in response to an element of said first value said generator develops a voltage waveform having a low absolute level during a first subperiod of a first period, a high absolute level during a second subperiod of said first period, and a low absolute level during a succeeding second period, and in which in response to an element of said second value said generator develops a voltage waveform having a low absolute level during a first period, a low absolute level during a first subperiod of a succeeding second period and a high absolute level during a second subperiod of said second period, and in which in response to an element of said third value said generator develops a voltage waveform having a low absolute level during first subperiods of first and second successive periods thereof and substantially identical levels during the second subperiods of said first and second successive periods thereof, whereby during said second period a signal of one polarity is developed on said first electrodes in response to an element of said first value, a signal of the opposite polarity is developed on said first electrodes in response to an element of said second value, and a signal of zero value is developed on said first electrodes in response to an element of said third value.

5. The apparatus of claim 3 in which said generating means includes a shift register having a plurality of stages, in which said reference word is in Manchester Code in which an element of one value is represented by a first level followed by a second level and an element of the other value is represented by said second level followed by said first level, in which each element of said reference word is stored in a respective pair of successive stages of said shift register, in which each of alternate stages of said shift register is coupled to a respective second electrode, and in which means are provided for shifting each element of said reference word in said shift register from a respective pair of stages to the next succeeding pair of stages at the periodicity of said voltage waveform.

6. The apparatus of claim 5 in which said shift register is a charge transfer shift register, and in which is provided a plurality of logic signal inverting circuits, each having an input connected to a respective one of successive pairs of stages and an output connected to a respective second electrode.

7. Signal correlator apparatus comprising:

a substrate of semiconductor material having a major surface, first means forming a first plurality of first charge storage regions adjacent said major surface of said substrate;

second means forming a first plurality of second charge storage adjacent said major surface of said substrate, each separated from a respective first charge storage region by a respective intermediate region and forming a respective charge storage cell of a first plurality therewith, said second means including a first plurality of first electrodes, each first electrode insulatingly overlying a respective first charge storage region, said first electrodes being interconnected, said second means including a first plurality of second electrodes, each insulatingly overlying a respective second charge storage region, means for providing a reference word having a series of successive elements, generating means for developing a series of voltage waveforms in response to said reference word including a series of cycles, each cycle having a duration equal to the sum of first and second periods, each period constituted of first and second subperiods, each waveform of said series being the same as the preceding waveform of said series except delayed by one cycle, means for introducing into each of successive ones of said first charge storage regions of said cells during first subperiods of first periods of said waveforms a respective one of successive quantities of charge, each quantity of charge being proportional to a respective sample of a first time-varying analog signal, means for applying each of said voltage waveforms generated by said generating means to a respective one of the second electrodes of said cells of said first plurality, a high absolute level of a waveform applied to a second electrode of a cell causing charge in the first storage region thereof to transfer to the second storage region thereof and a low absolute level of said waveform applied to a second electrode of a cell causing charge in the second storage region thereof to transfer to the first storage region thereof, each of said waveforms having a low absolute level during a first subperiod and an absolute level which is either high or low during a succeeding second subperiod in response to a respective element of said reference word, whereby charge in each cell is transferred between said first and second charge storage regions thereof in a time sequence determined by a respective element of said reference word, means connected in circuit with said first storage electrodes of said first plurality for sensing the total net charge transferred to and from said first charge storage regions during a common period of said voltage waveform, third means forming a second plurality of first charge storage regions adjacent said major surface of said substrate, fourth means forming a second plurality of second charge storage regions adjacent said major surface of said substrate, each separated from a respective first charge storage region by respective intermediate region and forming a respective charge storage cell of a second plurality therewith, said third means including a second plurality of first electrodes, each first electrode insulatingly overlying a respective first charge storage region, said first electrodes being interconnected, said fourth means including a second plurality of second electrodes, each insulatingly overlying a respective second charge storage region, means for introducing into each of successive ones of said first charge storage regions of said cells during first subperiods of first periods of said waveforms a respective one of successive quantities of charge, each quantity of charge being proportional to a respective sample of a second time-varying analog signal, means for applying each of said voltage waveforms generated by said generating means to a respective one of the second electrodes of said cells of said second plurality, a high absolute level of a waveform applied to a second electrode of a cell causing charge in the first storage region thereof to transfer to the second storage region thereof and a low absolute level of said waveform applied to a second electrode of a cell causing charge in the second storage region thereof to transfer to the first storage region thereof, each of said waveforms having a low absolute level during a first subperiod and an absolute level which is either high or low during a succeeding second subperiod in response to a respective element of said reference word, whereby charge in each cell is transferred between said first and second charge storage regions thereof in a time sequence determined by a respective element of said reference word, means connected in circuit with said first storage electrodes of said second plurality for sensing the total net charge transferred to and from said first charge storage regions during a common period of said voltage waveform.

* * * * *